United States Patent
Johnson

[11] 3,971,920
[45] July 27, 1976

[54] DIGITAL TIME-OFF-EVENT ENCODING SYSTEM

[75] Inventor: Robert P. Johnson, Granada Hills, Calif.

[73] Assignee: The Bendix Corporation, North Hollywood, Calif.

[22] Filed: May 5, 1975

[21] Appl. No.: 574,830

[52] U.S. Cl. .................. 235/92 SH; 179/15 BS; 340/172.5; 235/92 EC; 235/92 DP; 235/92 R
[51] Int. Cl.² .................................. H03K 21/00
[58] Field of Search ....... 235/92 SH, 92 EC, 92 DP, 235/92 MS, 92 PS, 92 LG, 92 R; 340/172.5; 445/1; 179/15 A, 15 BS, 15 BV; 328/41, 43; 307/221 R, 269

[56] References Cited
UNITED STATES PATENTS

| | | | |
|---|---|---|---|
| 3,573,742 | 4/1971 | Riddell | 340/172.5 |
| 3,708,690 | 1/1973 | Paivinen | 307/221 R |
| 3,778,778 | 12/1973 | Ragen | 445/1 |
| 3,862,373 | 1/1975 | Cohen et al. | 179/15 BV |
| 3,867,579 | 2/1975 | Colton et al. | 179/15 BS |
| 3,887,769 | 6/1975 | Cichetti, Jr. | 235/92 DP |
| 3,896,417 | 7/1975 | Beecham | 340/172.5 |

*Primary Examiner*—Raulfe B. Zache
*Assistant Examiner*—John P. Vandenburg
*Attorney, Agent, or Firm*—Robert C. Smith; William F. Thornton

[57] ABSTRACT

A digital storage system provides an economical means by which binary data words describing a series of events occurring randomly in time can be stored during a recording period and later retrieved in their sequence of occurrence with the time-of-event information preserved. A first recirculating shift register memory having arbitrarily great length, such as 4096 cells, each cell capable of storing a parallel binary data word such as 6 (or N bits), a second recirculating shift register memory of equal length, similarly capable of storing parallel binary error codes, and a cell counter having a counting capacity equal to the numerical length of said shift register memories are clocked in synchronism and comprise the storage medium. A clock control circuit provides shift clock pulses to said shift register memories and cell counter at basic clock intervals such as 16 microseconds during data absence, but alternatively provides a "premature" shift clock pulse when a "data ready" flag appears, causing the entry of a data word into said first shift register memory. An error encoder circuit provides a binary count of sub-intervals of the basic clock interval, such as zero through fifteen microseconds (vernier time count), and provides a binary count of the excess of shift clock pulses over basic clock intervals (borrowed time count) when data words arrive at a rate higher than the basic clock rate, up to a maximum excess such as 15 units, each equivalent to one "prematurely" clocked cell. Said vernier time count and borrowed time count comprise an error code which is supplied to said second shift register memory and entered into storage simultaneously with the entry of each data word. An event time correction circuit provides time-of-event information during data retrieval, arithmetically combining the vernier time and borrowed time error code supplied by said second shift register memory with the event storage location number which represents approximate time-of-event and is supplied by said cell counter. The retrieved data thus appears as a column of simultaneous bits consisting of the descriptive data word(s) and the time of event.

7 Claims, 4 Drawing Figures

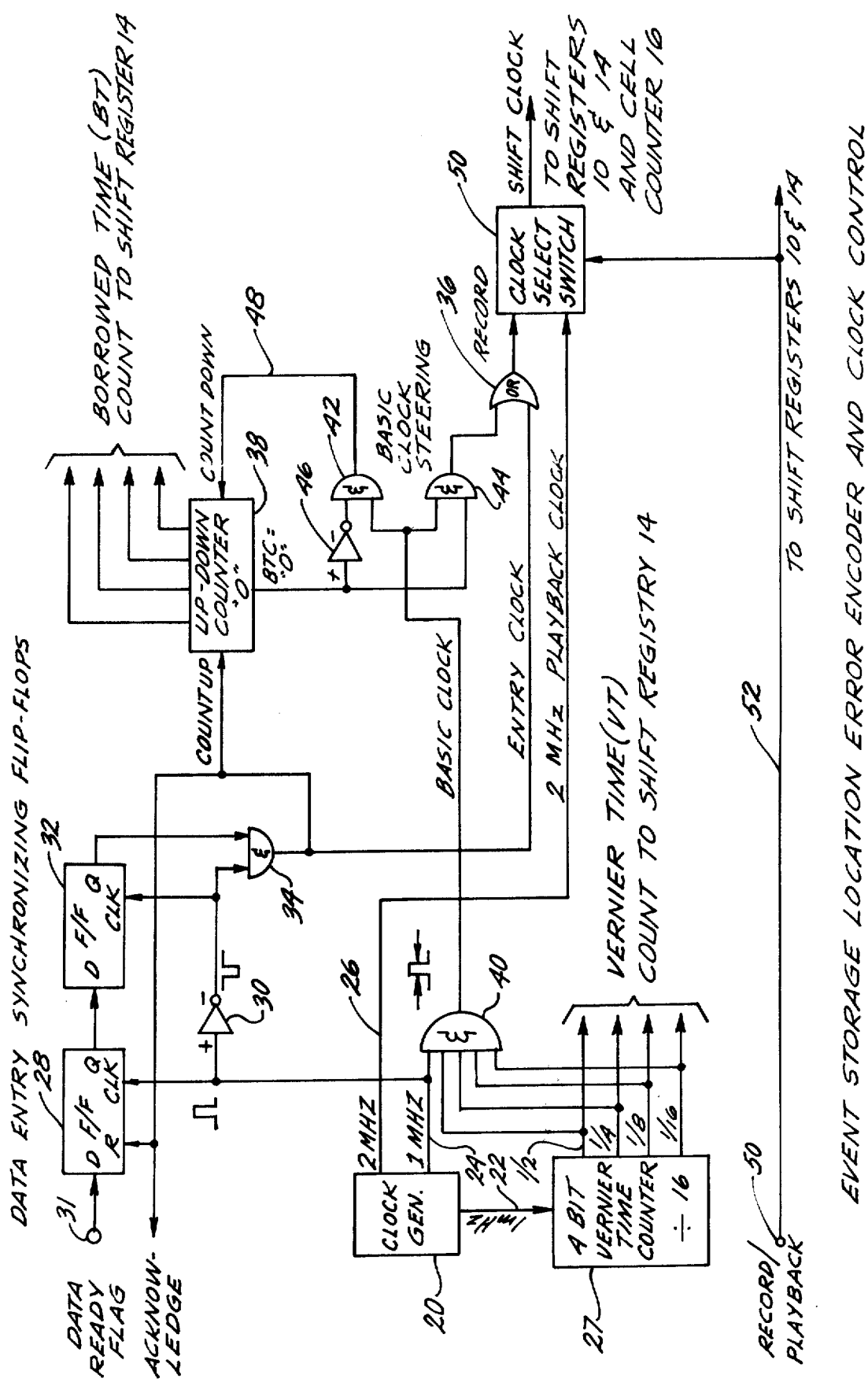

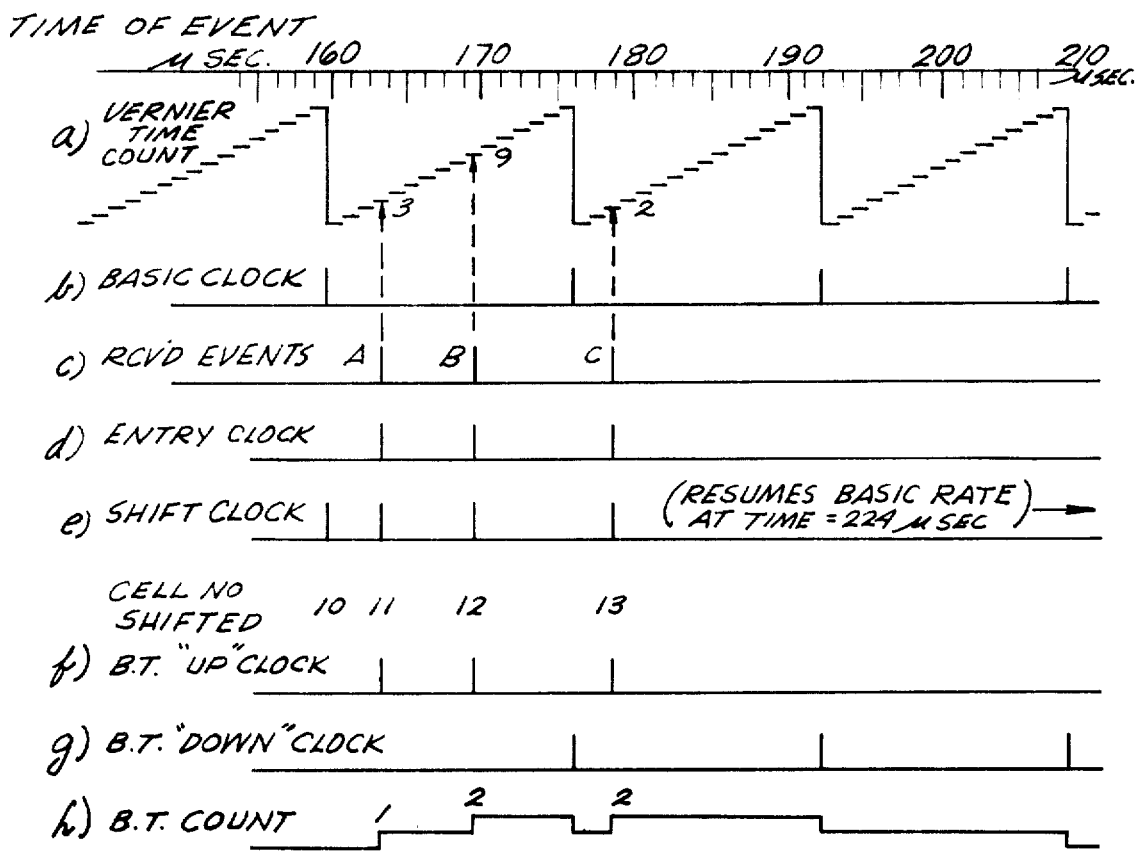

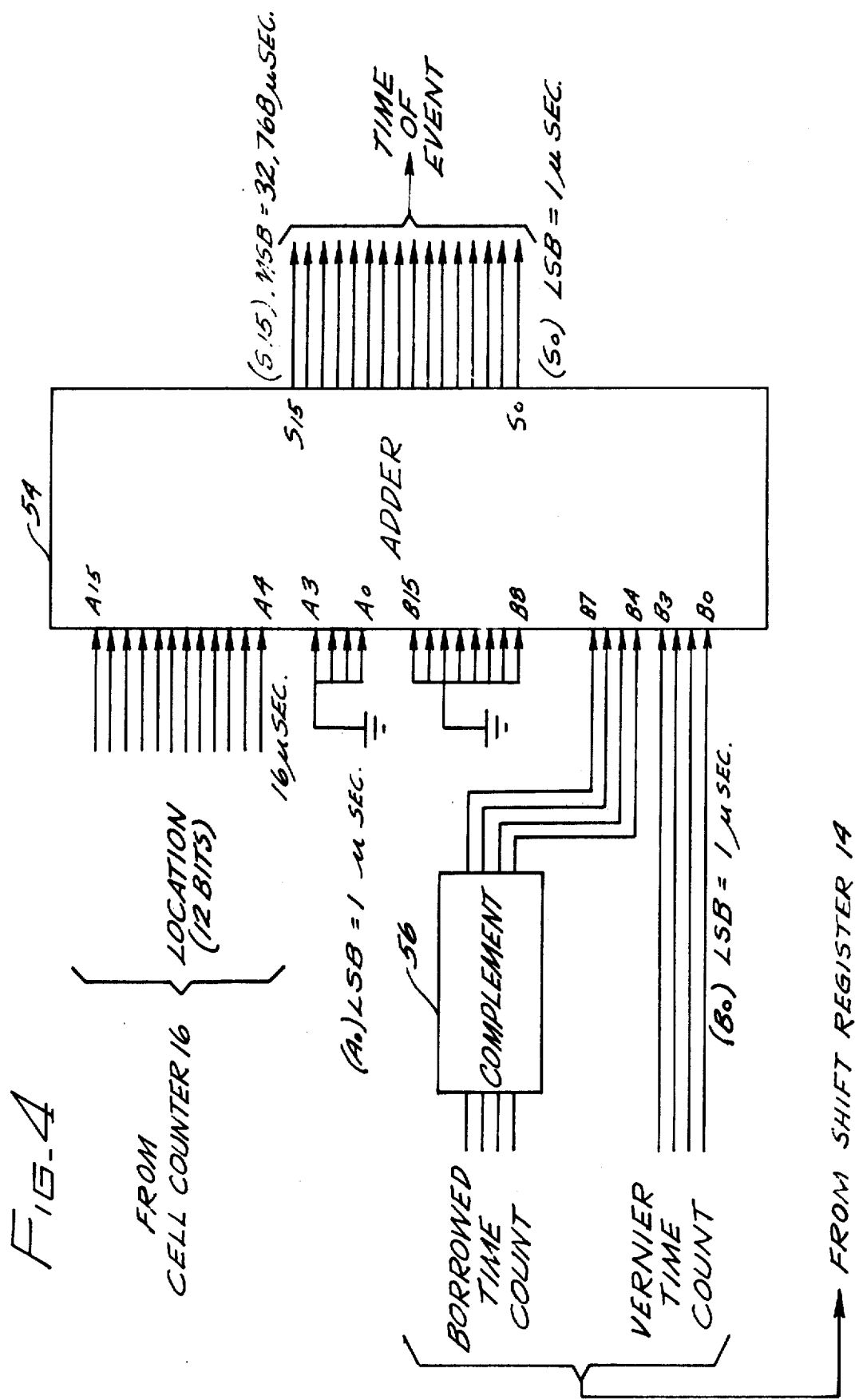

DIGITAL TIME-OFF-EVENT ENCODING SYSTEM

BACKGROUND OF THE INVENTION

There are numerous applications in which long shift registers are used to store digital data in a time-related fashion. Examples of such applications are the storage of single or multiple radar pulse trains for signal processing and the storage of television image data, especially computer graphics images. Shift register memory is also well suited to digital test equipment applications where an "instant replay" of events leading up to an anomalous condition is desired. Shift registers have the capability to accept binary data present at the input and duplicate that data at a later time at the output. Each bit of data entered moves one cell toward the output each time a clock pulse occurs. Contemporary shift registers have as many as 2048 cells in a single integrated circuit, and their relatively low cost per bit makes them an economical storage medium where random access to data is not required.

Conventional shift register memories are of two basic types, static and dynamic. The static type is clocked each time data appears, so that consecutive inputs always occupy consecutive cells. This provides storage efficiency through high density of data in the medium, but sacrifices all time-of-event information except sequence. Time information is sometimes encoded (counted) and stored along with the other data, necessitating additional storage capacity.

The dynamic type employs a clock pulse at a fixed rate such that the overall time for data to appear at the output is equal to the number of cells multiplied by the clock interval. The function of this type is similar to a delay line, except that there is an uncertainty in the delay time of plus or minus one clock interval, since data appearing between clock pulses is not entered until the next clock pulse occurs.

To illustrate the relative storage capacity required to mechanize either of the above types, an example of a storage requirement is given. Assume a series of events numbering up to 4096, each described by a 6-bit parallel binary data word which must be stored and retrieved along with time-of-event information having an accuracy of one microsecond within a 65,536-microsecond period of observation (recording). The static type shift register memory would require shift registers having a length of 4096 cells to accommodate 4096 events connected in a parallel-fed array to make each cell column capable of storing 22 bits of data (6 bits description and 16 bits time). The total static storage capacity required would thus be 22 × 4096 or 90,112 bits. The dynamic type would require only 6 bits parallel input capacity (for description) but to achieve the required time resolution, it would have to be clocked at a 1 MHz rate, necessitating a shift register length of 65,536 cells to cover the recording period. The total dynamic storage capacity required would therefore be 6 × 65,536, or 393,216 bits. This mechanization has very low storage efficiency, since over 65,000 cell columns are used to store a maximum of 4096 data words.

SUMMARY OF THE INVENTION

The object of this invention is to improve the storage efficiency of shift register memory systems in applications requiring time-of-event retrieval where input data rate extremes can be presumed to stay within known limits. In many applications such limits do exist; that is, the number of events in any interval within the period of observation is limited to known maxima for given lengths of such interval. This invention uses some principles of the aforementioned dynamic or delay line memory, but the length of the shift registers is not dictated by the required time-of-event accuracy. Instead, the length is chosen just sufficient to accommodate the overall maximum number of data words, and the time accuracy is preserved by encoding and storing a "vernier time" count representing the timing error between the fixed basic clocking time and the actual time of event. To avoid time ambiguity when the input data rate sporadically exceeds the basic clock rate (more than one data word per clock period), the concept of "borrowed time" is employed, where the memory is clocked prematurely as many times as necessary to store said data and the number of premature clock pulses is tallied and also stored with each data word. The result is effectively a delay line memory with a time base which can be momentarily distorted, the amount of such distortion being itself stored and used to correct the retrieved time data for each event. For the aforementioned example requirement (to store 4096 events over 65,536 microseconds), this invention can be mechanized using a total of 57,344 bits of shift register, an improvement of 36 percent over the conventional static shift register memory, yet capable of accepting sporadic data rates as high as 16 times greater than the basic clock rate.

DESCRIPTION OF THE DRAWINGS

FIG. 2 is a block diagram of the time-of-event encoder used with my system;

FIG. 3 is a graph including a series of timing patterns showing time relationships of several of the signals used in my system; and FIG. 4 is a block diagram showing details of the event time correction circuit shown in FIG. 1.

DESCRIPTION OF THE PREFERRED EMBODIMENT

Figure 1:
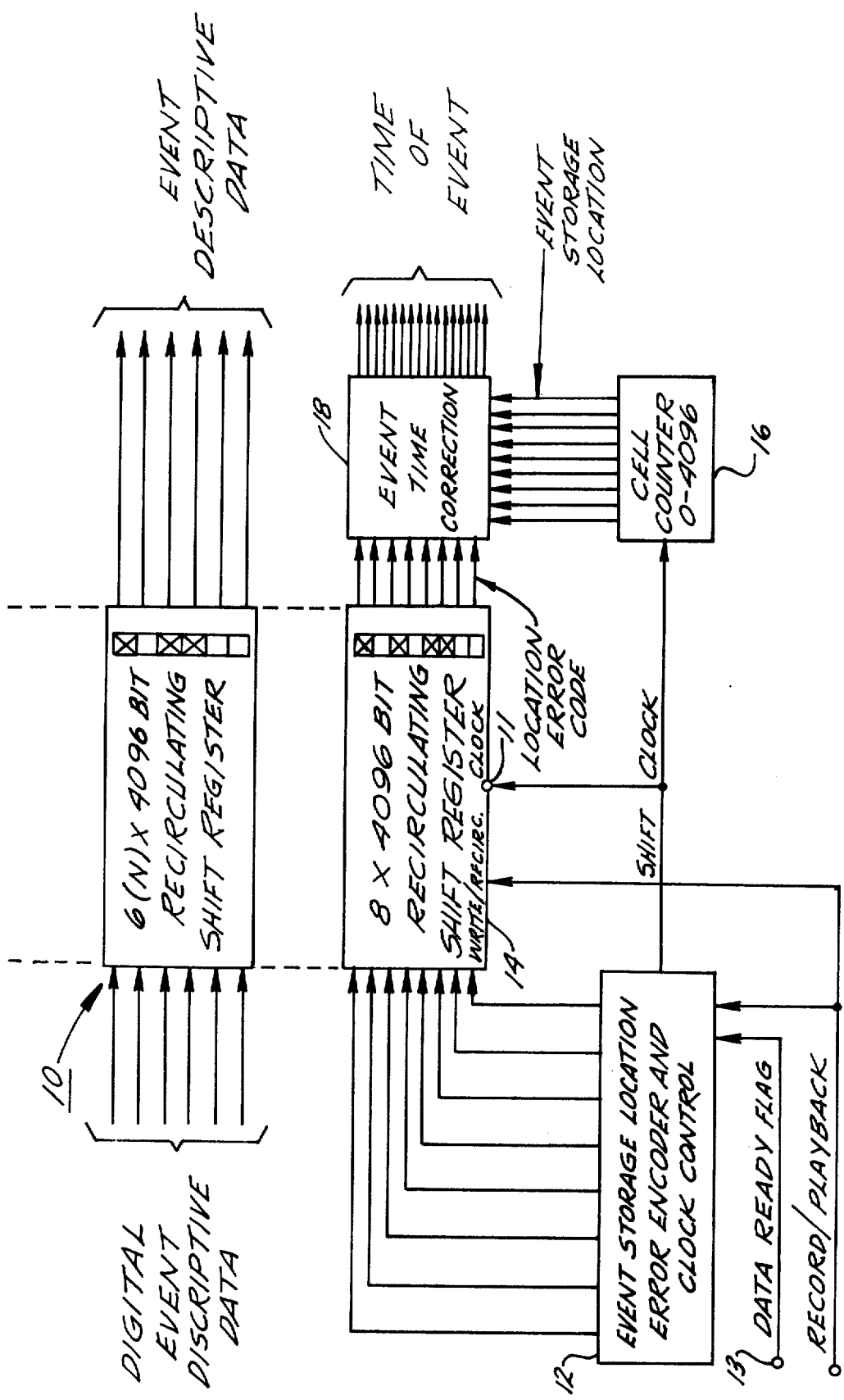
FIG. 1 is a block diagram of my time-of-event storage system.

Referring now to FIG. 1, digital data reflecting a value or description of an event and which may be described by any practicable number of data channels is supplied to a recirculating shift register 10 of a conventional type. While it has been shown as having six channels of input, this number could be any desired number N. Numbers of channels as high as 96 would not be atypical. Similarly, while the register is shown as having 4096 bits per channel, any suitable number may be chosen, as will be clear to those skilled in the art. Each digital word of data appears as an input to a block of cells at the input of register 10. This input is read into said cells, and the register is then caused to shift said word of data one step to the right. This shifting is initiated by means of a clock pulse applied to a clock input terminal 11, as shown. The source of the clock pulses is discussed below. The data is propagated through the shift register at clock-controlled intervals and is retained in storage by being recirculated internally back to the input of the register. Each time a block of data appears on the input to the system an input pulse appears at the "data ready flag" terminal 13 of an event storage location error encoder and clock control 12 which causes said control 12 to synchronize the entry of said data. Other timing means acts to supply record and playback signals to the WRITE/RECIRCULATE terminal of the shift register 10 on a regular schedule or as desired, to cause said register to either write data into the register or recirculate data from the output end to the input. Thus, as the column of data moves into the shift register 10 the control 12 determines the exact time when such data arrived, and this information is carried as an additional column of data on corresponding cells of the 8 × 4096 bit recirculating shift register 14 which is coordinated with shift register 10. Control 12 provides a shift clock signal which is supplied to shift registers 10 and 14 and also to a cell counter 16. Cell counter 16 is thereby synchronized to the shift registers, and it recycles through a count of 4096 each time the shift registers 10 and 14 recirculate. Its output, therefore, represents the cell number of each data column as it reaches the shift register output and is recirculated. An event time correction circuit 18 receives from the shift register 14 a column of data representing the time correction data pertaining to the descriptive data simultaneously arriving at the output of register 10, and this correction data is arithmetically combined with the cell counter output to provide precise time-of-event data corresponding to the descriptive output of shift register 10.

The event storage location error encoder and clock control 12 is shown in block diagram in FIG. 2. It includes a clock generator and divider 20 which produces pulse outputs at 1 MHz on lines 22 and 24 and an output at 2 MHz on a line 26. The 1 MHz pulses are supplied to a 4-bit vernier time counter 27 which is effective to divide the 1 MHz pulses by 2, 4, 8 and 16, thus providing outputs at ½ MHz, ¼ MHz, ⅛ MHz and 1/16 MHz, which output pulses are supplied as binary input signals to the shift register 14 (FIG. 1) to retain time relationships of events occurring at points within the basic 16-microsecond clock interval as discussed below. On the timing diagram (FIG. 3) a representation of the vernier time count is shown on graph $a$ indicating a separate count for each 1 microsecond, with the vernier count being reset to zero each 16 microseconds. The 1 MHz clock pulse is also supplied to a first flip-flop circuit 28 and, after being inverted in an inverter 30, to a second flip-flop circuit 32. Flip-flop 28 also receives the input pulses from the "data ready flag" terminal 31. The pulse from inverter 30 is also supplied to an AND gate 34 where it is compared with the output of flip-flop 32. If flip-flop 32 has an output, representing a signal from the "data ready flag" terminal 31, AND gate 34 will supply entry clock pulses to an OR gate 36, to an up-down counter 38, and as an acknowledgement pulse to reset flip-flop 28 to place it in condition to receive the next input pulse, as well as to any other elements in this or associated systems which need to be reset when ready to receive a new input pulse. Data pulses received more rapidly than the 16-microsecond basic clock interval are entered as "up" counts into the up-down counter 38, and the instantaneous value of this borrowed time count, if any, is supplied as a binary input to the storage register 14.

Connected to all output terminals of the vernier time counter 27, as well as to the 1 MHz pulse on line 24, is an AND gate 40 which responds to completion of total count through vernier time counter to provide an output consisting of regularly spaced basic clock pulses at intervals of 16 microseconds which are initiated by and synchronized with the 1 MHz output of clock 20.

The basic clock pulses are shown at graph $b$ on the timing diagram (FIG. 3). This basic clock pulse is supplied to a pair of AND gates 42 and 44, each of which is connected to receive a zero count logic output from the up-down counter 38, the output to gate 42 being connected through an inverter 46. When the up-down counter 38 indicates a borrowed time count of zero, the output of inverter 46 is such that AND gate 42 has no output and there is no input to counter 38 on the "count down" line 48. This same output representing zero borrowed time does enable AND gate 44 such that the basic clock pulse is supplied through gate 44 to the OR gate 36 where it is combined with the "entry clock" pulse output from AND gate 34.

If the basic clock pulse arrives at AND gate 42 at a time when there are borrowed time counts stored in the up-down counter 38, the output of counter 38 will be such as to enable gate 42 and disable gate 44, thus providing one countdown pulse (subtracting one count of borrowed time) to counter 38 and blocking the basic clock pulse to OR gate 36. This will be the mode of operation so long as there are borrowed time counts stored in counter 38, and only the entry clock pulses from AND gate 34 will pass OR gate 36. These entry clock pulses and any unblocked basic clock pulses are connected through a "clock select" switch 50 as shift clock pulses to advance both shift registers 10 and 14 and the cell counter 16 by one position in synchronism. The switch 50 is essentially a two-position switch which in the "record" position clocks data into the shift registers and when in the "playback" position simply supplies 2 MHz playback pulses to the shift registers without the "borrowed time" and "vernier time" features discussed above. Switch 50 is caused to provide either "record" or "playback" pulses to the shift registers either automatically in a desired time sequence or as desired by means of an input signal from a terminal 50 on a line 52.

Operation of the clock control 12 may be best understood by considering a typical operating situation in conjunction with the timing diagrams of FIG. 3. With the system in the "record" mode, input data pulses A, B and C are received at input terminal 31 at a rate in excess of the basic clock rate (graphs $b$ and $c$). These pulses appear in graph $c$ and correspond with microseconds 163, 169 and 178 as counted on the vernier time count (graph $a$). These data pulses will result in corresponding entry clock pulses from AND gate 34 as shown in graph $d$. Since pulses A and B both occur within one basic clock cycle, they provide two "up" or borrowed time counts to the up-down counter 38 (see graph $b$). This will result in the next two basic clock pulses being blocked, and both entry clock pulses are supplied through OR gate 36 and switch 50 to shift the shift registers 10 and 14. Arrival of the next basic clock pulse at the AND gate 42 results in providing one "down" pulse to counter 38 (graphs $g$ and $h$). Arrival of input pulse C again provides an "up" count to counter 38, giving again a total of two "borrowed time" counts. The next two basic clock pulses at microseconds 192 and 208 result in "down" counts but no shift clock pulses which result in reducing the borrowed time count to zero. Unless more data pulses are received in the next 16 microseconds, the next shift clock pulse will again be the basic clock pulse at 224 microseconds.

While the shifting of the shift registers is being controlled as described above, the timing of each shift is entered into shift register 14 as a 4-bit digital number from the vernier time counter 27 and the borrowed time count as a 4-bit digital number from the up-down counter 38. Thus, a given column of data as carried on the shift registers 10 and 14 will include 6, or N, bits of data describing the given event and eight bits describing the timing of the event. Some examples of the time-of-event coding appear in the table below which describes this coding as for data pulses A, B and C, referred to above:

| EVENT TIME DATA STORED: | | PULSE | A | B | C | |
|---|---|---|---|---|---|---|
| Borrowed time count | | | 1 | 2 | 2 | |
| Vernier time count | | | 3 | 9 | 2 | |
| TIME OF EVENT RETRIEVAL: | A | B | C | | | DATA SOURCE |
| 16 × Cell No. | | | 176 | 192 | 208 | Cell counter |
| −16 × B. T. count | | | −16 | −32 | −32 | 4 bits B. T. code |
| + V. T. count | | | + 3 | + 9 | + 2 | 4 bits V. T. code |
| = Time of Event | | | 163 | 169 | 178 | |

From this table it will be recognized that pulse A gives rise to one borrowed time count, pulse B to two, and pulse C to two, as described above. The vernier time counter 27 will indicate 3 counts (from the basic clock) for pulse A, 9 for pulse B, and 2 for pulse C. Upon retrieval of pulse A, its time code is expressed as 16 times the cell number (16 microseconds/basic clock pulse) and assuming the eleventh cell, this gives a number of 176 minus the borrowed time count (−16) and plus the vernier time count (+3) gives rise to a count of 163 which is just where it appears on timing diagram (FIG. 3). With the second pulse B, it is necessary to place this data in the next cell, so the 12th cell × 16 results in a count of 192 minus the borrowed time count (in this case, 2 × 16 or 32) plus the vernier time count of 9, or 169. Again, this is as shown on FIG. 3. Count C is computed in the same way in that being the next input data pulse it must be read into the next, or 13th, cell which with the basic clock pulse should occur at a count of 208. With two counts in the borrowed time counter, this subtracts 32 counts, as above, and the vernier counter adds two counts to make a total count of 178. In this way, the time relationships of the pulses are retained because each data pulse is entered into a cell immediately without waiting for the next basic clock pulse. The effect is to momentarily distort the 16-microsecond-per-cell characteristic of the storage registers, but the cumulative amount of distortion at any cell is indicated by the excess count in the borrowed time counter. Obviously the maximum value of borrowed time which can be accumulated by the 4-bit up-down counter 38 is 15 units in the first basic clock period of 16 microseconds. At the end of this period a new basic clock pulse will shift the counter 38 by one "down" count, thus making room for one additional input pulse in the second clock period. Therefore, in a 32-microsecond period of two basic clock pulses, the total number of input pulse events which can be accomodated by the 4-bit system described would be 16. With more capacity in the counter 38, a greater number of high rate events could be stored in a given time. Addition of 1 bit to make a 5-bit counter would result in increasing the borrowed time counter capacity to 31 units accumulated over two basic clock pulse intervals. Thus one additional bit in the up-down counter 38 could result in effectively doubling the "borrowed time" storage capacity. This would also assume that an additional row of data cells is made available in the storage register 14.

From the foregoing it will be recognized that as each column of data from the shift register 14 reaches output of the register (during data retrieval), it will be supplied to the event time correction circuit 18 in synchronism with the output from the cell counter 16 which keeps track of the proper cell count for each event. Circuit 18, shown in somewhat more detail in FIG. 4, includes an adder 54 which has addend input terminals $A_0$ through $A_{15}$ and $B_0$ through $B_{15}$. As shown, terminals $A_0$ through $A_3$ and $B_8$ through $B_{15}$ are grounded. Terminals $A_4$ through $A_{15}$ receive cell number location data from the cell counter 16, which information identifies one of the 4096 cells in a 12-bit binary code. With terminals $A_0 - A_3$ grounded, the least significant bit on terminal $A_4$ signifies 16-microsecond intervals corresponding to one basic clock pulse. The borrowed time and vernier time counters require only eight bits, as described, and the least significant bit of the vernier time counter is one microsecond. As indicated in the table above, the borrowed time count is subtracted from the basic clock count, so the borrowed time count is supplied through a complement unit 56 which causes the borrowed time count to be supplied to the adder 54 in such manner that it subtracts from the basic clock count. The vernier count is then added to produce the final event time figure which issues from the system simultaneously with the digital event description from shift register 10.

I claim:

1. A shift register storage system for receiving and storing digital data words including a first storage register means and a clock operated at a fixed clock rate to produce pulses such that location of said data words in said register means reflects time of arrival of each said data word wherein the improvement comprises:
   gating means to produce additional clock pulses in response to the arrival of data words,
   a first counter to provide incremental digital time error data reflecting the difference between data arrival time and the time of said fixed clock pulses,
   an up-down counter to tally any excess of said additional clock pulses over said fixed clock pulses,
   switching means to prevent said fixed clock pulses from clocking said first shift register when said excess tally is other than zero,
   a cell counter synchronized with and having a counting capacity equal to the length of said first shift register means such that the output of said cell counter enumerates the cells of said first shift register means, and
   additional shift register means synchronized with said first shift register means and said cell counter and receiving and storing the outputs of said first counter and said up-down counter such that the precise time of arrival of each stored data word may be calculated during data retrieval from the corresponding stored outputs of said first counter and said up-down counter and the output of said cell counter.

2. A shift register storage system as set forth in claim 1 wherein adder means are connected to the outputs of said cell counter and said second shift register means for combining said outputs such that each of said digital data word is retrieved simultaneously with its calculated time of arrival data.

3. A shift register storage system as set forth in claim 1 wherein said clock includes means generating output pulses at a high frequency and a vernier time counter connected to said pulse-generating means including means for dividing said high frequency by a desired integer to provide said clock pulses at said fixed clock rate.

4. A shift register storage system as set forth in claim 3 wherein said gating means includes multivibrator means receiving input pulses in coincidence with the arrival of said digital data words at said first storage register means, said multivibrator means being connected to receive said high frequency output pulses, and producing said additional clock pulses in synchronism with individual said high frequency pulses.

5. A digital time-of-event storage system comprising:
recirculating shift register means for receiving parallel digital data descriptive of an event and time code data describing time of arrival of said descriptive data,
time-of-arrival encoding means including a clock generator for generating a high frequency pulse counter means responsive to said high frequency pulse providing a cyclic binary count and a basic clock pulse at a lower frequency, and multivibrator means for receiving input pulses coincident in time with arrival of each column of data,
gating means for receiving said input pulses and said high frequency pulses to provide entry pulses, each of which acts to shift said register means by one cell, thereby entering said descriptive data and time code data into storage,
counter means responsive to each said entry pulse to accumulate one "up" count and to provide a first output reflecting the presence or absence of accumulated counts and a second output reflecting the number of stored counts which is connected to said shift register means,
additional gating means responsive to said basic clock pulses and connected to said first output such that when counts are accumulated in said counter means each said basic clock pulse is connected to subtract one count from said counter and when no counts are present said basic clock pulse is connected to shift said shift register means by one cell such that said time code data is shifted with the corresponding digital descriptive data,
a cell counter responsive to the pulse shifting said shift register means, and
adder means connected to the output of said cell counter and to said shift register means for combining said outputs to provide columns of digital data, each of which is both descriptive of said event and its time of arrival.

6. A digital time-of-event recording system comprising a first recirculating shift register for receiving digital data descriptive of a series of events;
a second recirculating shift register having a number of cells the same as said first shift register for receiving encoded digital data descriptive of the timing of each of said events;
a cell counter having a count capacity corresponding to the number of cells in each of said shift registers;
means for effectively encoding time of arrival of each of said events including a clock generator capable of generating output pulses at a high frequency;
multivibrator means receiving input pulses in coincidence with the arrival of data represented by said pulses at said first shift register, said multivibrator means having a clock terminal connected to said high frequency output pulses,
a first AND gate connected to receive said high frequency output pulses and the output of said multivibrator means for providing an entry clock pulse corresponding to each column of input data,
an up-down counter connected to receive said entry clock pulses and to respond by providing one "up" count for each entry clock pulse, said counter having an output terminal whose condition reflects either a zero count or a non-zero count, and an output signal reflecting the number of stored or borrowed counts to said second shift register,
a vernier time counter connected to said clock generator providing a binary count of said high frequency to said second shift register including means for dividing said high frequency by a desired integer to provide clock pulses at a lower frequency,
a second AND gate connected to receive said binary count and said clock generator output to provide a basic clock pulse output at said lower frequency,
a second AND gate connected to receive said binary count and said clock generator output to provide a basic clock pulse output at said lower frequency,
an OR gate connected to receive said entry clock pulses and to connect said entry clock pulses to said shift registers to cause said shift registers to shift one cell for each entry clock pulse,
third AND gate means responsive to said basic clock pulse and to the output condition registered at said up-down counter such that when no count is stored in said counter, said basic clock pulse is connected to said OR gate causing said shift registers to shift one cell at the basic clock rate and when a count is stored in said counter said basic clock pulse is supplied to said counter to provide one "down" count; and
an event time correction means connected to the output of said second shift register and to said cell counter for combining said outputs to provide a column of digital data which is both descriptive of the event and of its time of arrival.

7. A digital time-of-event recording system as set forth in claim 6 wherein said entry clock pulse is also connected to reset said multivibrator means to receive a new input pulse.

* * * * *